US008219349B1

(12) United States Patent
Schwarz et al.

(10) Patent No.: US 8,219,349 B1
(45) Date of Patent: Jul. 10, 2012

(54) TEST MANAGEMENT SYSTEM

(75) Inventors: Yoram Schwarz, Santa Clara, CA (US); Yoshiki Ashizawa, Pleasanton, CA (US); Patrick Ngatchou, Santa Clara, CA (US); Heng-Cheng Pai, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 646 days.

(21) Appl. No.: 11/963,004

(22) Filed: Dec. 21, 2007

(51) Int. Cl.
*G01R 31/00* (2006.01)
*G01R 31/14* (2006.01)
*G01R 31/26* (2006.01)
*G06F 19/00* (2011.01)
*H01L 21/66* (2006.01)

(52) U.S. Cl. ........ 702/118; 702/121; 702/117; 700/121; 438/14

(58) Field of Classification Search .......... 702/117–121, 702/58, 59, 81–83, 108, 124, 126, 183, 185, 702/189; 700/108, 109, 121; 438/14, 17; 324/500, 537, 750, 754, 755, 759, 763–765
See application file for complete search history.

(56) References Cited

U.S. PATENT DOCUMENTS

| | | | |
|---|---|---|---|
| 6,031,990 A | 2/2000 | Sivakumar et al. | |
| 6,236,952 B1 * | 5/2001 | Jun et al. | 702/119 |
| 6,708,132 B1 * | 3/2004 | Gutierrez et al. | 702/117 |
| 6,782,331 B2 * | 8/2004 | Ayadi | 702/68 |
| 6,941,232 B2 * | 9/2005 | Burke et al. | 702/57 |
| 6,975,955 B1 * | 12/2005 | Lukindo | 702/119 |
| 6,983,233 B1 | 1/2006 | Falcioni et al. | |
| 6,984,198 B2 | 1/2006 | Krishnamurthy et al. | |
| 6,996,550 B2 | 2/2006 | Wang et al. | |
| 7,155,361 B2 | 12/2006 | Huang | |
| 7,237,160 B2 | 6/2007 | Lu et al. | |
| 7,474,420 B2 * | 1/2009 | Li et al. | 356/630 |
| 2004/0239359 A1 * | 12/2004 | Matsumoto | 324/763 |
| 2004/0267477 A1 * | 12/2004 | Scott et al. | 702/108 |
| 2006/0130041 A1 * | 6/2006 | Pramanick et al. | 717/168 |
| 2009/0006014 A1 * | 1/2009 | Chanda et al. | 702/65 |

* cited by examiner

*Primary Examiner* — Mohamed Charioui
*Assistant Examiner* — Ricky Ngon

(57) ABSTRACT

A test management system is provided that performs tests on integrated circuit test structures. A server may be used to distribute a test recipe to multiple test cells. Each test cell may have multiple test instruments and associated instrument drivers. When performing a test, a test type module may run on a given test cell. The test type module may perform tests by using the instrument drivers to control the test instruments available in the test cell. Users may make test option selections using graphical interface screens such as a test recipe setup screen and a platform engine control screen. A user can select test sites for testing based on which process parameters where used to fabricate the test structures associated with the test sites or other criteria.

26 Claims, 6 Drawing Sheets

TEST MANAGEMENT SYSTEM

BACKGROUND

This invention relates to systems for performing tests on integrated circuit test structures.

Integrated circuit research and development involves testing. In a typical scenario, test structures are fabricated on a wafer or other substrate using semiconductor manufacturing techniques. For example, test structures may be fabricated to permit characterization of the electrical properties of a thin film such as the thin film's resistivity. A relatively simple test structure may be formed by depositing a blanket film on a substrate. More elaborate test structures such as patterned traces and prototype electrical devices may also be formed.

Integrated circuit test structures that may be fabricated include blanket films, resistors, capacitors, transistors, memory cells, and serpentine traces. Test structures such as these may be characterized using test instruments such as voltmeters, voltage generators, capacitance meters, ellipsometers, function generators, lock-in amplifiers, etc. Measurements of various parameters such as current, voltage, resistance, capacitance, inductance, breakdown voltage, etc. can be made using these test instruments. A probe station may be used to make electrical contact with the appropriate test structures on a wafer during characterization measurements.

The characterization of test structures during research and development operations may make it possible to avoid potential design problems and thereby improve device performance in a final integrated circuit design. Testing may also be performed in a manufacturing environment.

Because of the large variety of measurement instruments that are used during testing, test measurement systems can become extremely complex. It can therefore be difficult to develop software that interfaces properly with various test instruments. Each instrument may be controlled using a different set of commands using potentially unique protocols. Moreover, instruments may be capable of measuring parameters over different ranges and may be connected to different probe stations. These complexities tend to make the process of characterizing test structures difficult to automate.

It would therefore be desirable to be able to provide improved ways of testing of test structures for integrated circuits.

SUMMARY

In accordance with the present invention, a system for testing integrated circuit test structures is provided. A server may be used to distribute test recipes to multiple test cells over a network. Each test cell may have an associated set of instruments, a probe station, and a test controller.

Each test cell may have a platform engine and a number of associated test type modules. When performing the tests specified in a test recipe, one or more appropriate test type modules may be invoked by the platform engine of a test cell. Each test type module may use instrument drivers associated with the instruments in the test cell to interface with the test instruments and/or probe station to test the test structures at that test cell.

The instruments and instrument drivers that are available in each cell tend to vary. The same types of tests may be performed on different cells despite these differences. In a typical scenario, the same test type module may be run on different cells. On one cell, the test type module may perform a test using the test instruments of that cell. On another cell, the same test type module may perform the same test using the test instruments available on that cell. Different tests may also be performed. For example, at a given cell, test structures may be tested using multiple test type modules each of which performs different tests.

Further features of the invention, its nature and various advantages will be more apparent from the accompanying drawings and the following detailed description.

DETAILED DESCRIPTION

Figure 1:
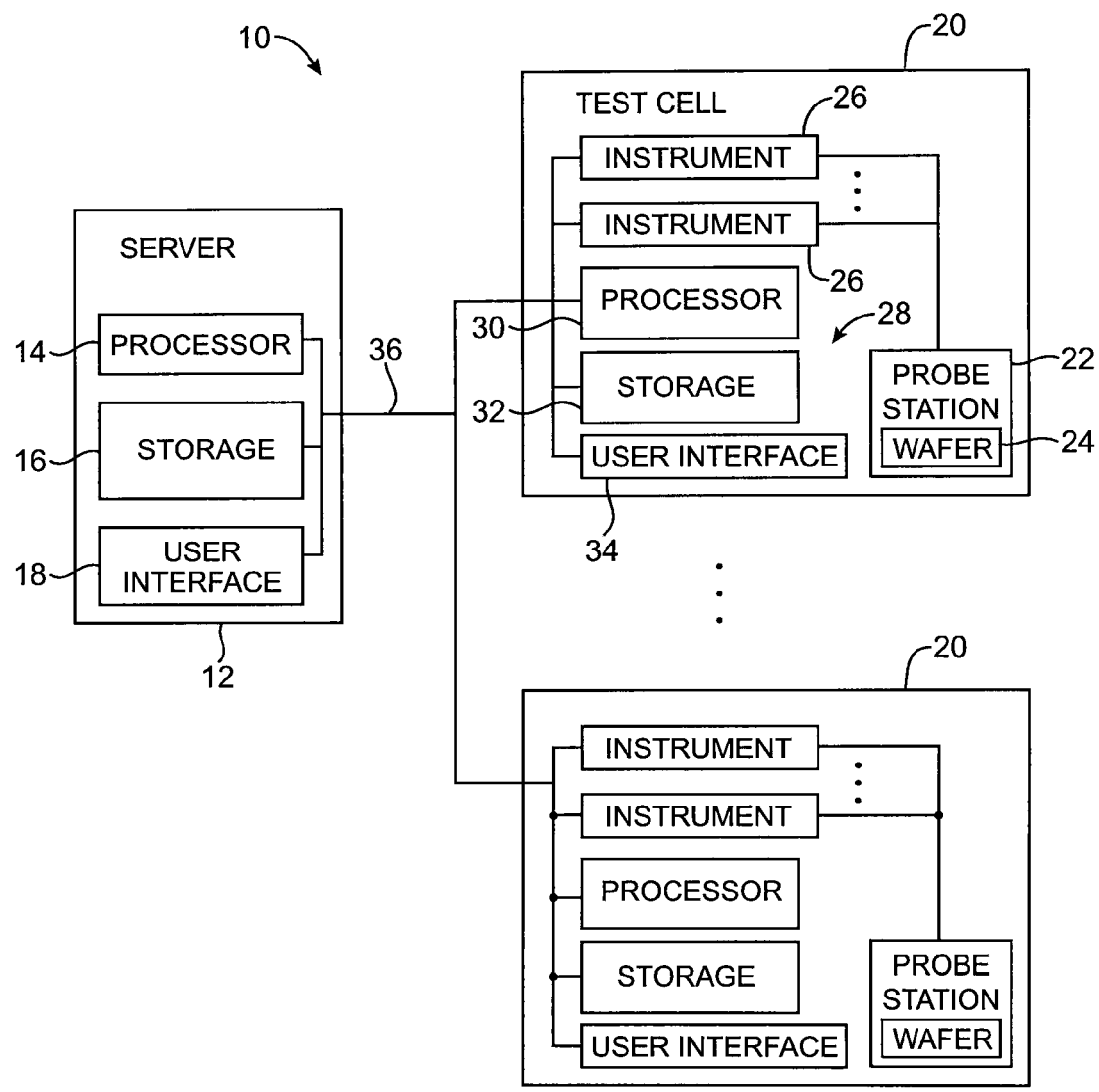
FIG. 1 is a diagram of an illustrative system for performing tests on test structures under the control of a test management system in accordance with an embodiment of the present invention.

The present invention relates to testing integrated circuit test structures. The test structures may be relatively simple test structures such as blanket films or serpentine paths. A current may be applied to a film or serpentine path to determine its resistance (as an example). This test measurement may then be used in determining the resistivity of a material of interest. Test structures may also be more elaborate structures. For example, a test structure may be used to model all or part of a complex electronic device that is formed from multiple conductive and dielectric layers. A voltage might, as an example, be applied across the layers of a test structure to determine the breakdown voltage of an electrical device. The test structures that are tested may, in general, include resistors, capacitors, transistors, memory cells, serpentine paths, straight paths, other suitable structures, or combinations of all or part of such structures.

Test structures such as these are commonly tested to gather information on integrated circuit fabrication techniques and devices for use in integrated circuits. As a result, test structures such as these are sometimes referred to as integrated circuit test structures. Any suitable semiconductor fabrication techniques may be used to form the test structures (e.g., thin film deposition, thermal treatment, etching, polishing, lithographic patterning, etc.).

Test structures may be formed on any suitable substrates. Examples of substrates on which test structures may be formed include glass, plastic, ceramic, or other suitable dielectrics semiconductors (e.g., semiconductor wafers or smaller pieces of a wafer referred to as "coupons," etc.), and conductors. In some arrangements, the test structures may be formed in a regular array of "die" on a substrate (e.g., in rows and columns of rectangular portions of a wafer or other suitable substrate). In a manufacturing environment, the substrate may be diced using a saw or other tool to form individual die for packaging. In a testing environment, individual die, blanket films, and other test structures are typically probed using a probe station.

A probe station has a probe head and positioning equipment. Probe contacts in the probe head are positioned at appropriate points on the test structures (e.g., on contact pads) to make electrical contact with the test structures. The positioning equipment that is used to control the location of the probe head in a probe station may be manually or automatically controlled.

Test systems in accordance with embodiments of the invention may have multiple test cells. Test cells are collections of hardware and software components that are used for testing test structures. A typical test cell will have a probe station, test instruments, and a test controller. Software may be used to execute test algorithms. The test algorithms may specify which instruments are to be used in a particular test and what ranges of parameters are to be measured. For example, a test algorithm to measure the breakdown voltage of a test structure might involve applying a voltage ramp from 0 volts to 20 volts with a voltage generator test instrument while measuring the current flowing through the test structure using a digital multimeter test instrument. The software application components that are used to execute specific test algorithms are sometimes referred to as test types or test type modules. For example, a breakdown voltage test type module might be used to perform voltage breakdown measurements.

Test types are modular encapsulated test algorithms. The inputs to each test type module include recipe data, product layout data, and design data. The outputs of each test type module include measured results. Test types are adjusted via configuration dialogs to point to specific instrument drivers (modular encapsulated plug-in modules).

Different test cells may have different collections of test instruments. For example, one test cell might have a voltage generator that has a sweep range of 0 to 20 volts with 0.1 volt accuracy, whereas another test cell might have a voltage generator with a range of 0 to 100 volts with 0.5 volt accuracy. The voltmeters may be manufactured by different entities and may use different command sets and communications protocols. For example, one voltmeter might communicate over Ethernet cables using one instruction set, whereas another voltmeter might communicate over an IEEE 488 parallel bus using a second instruction set. Features that are available on one of the multimeters may be implemented differently on the other multimeter or may not be available. Moreover, one test cell may include test instruments that are not present in another test cell.

To address the variability in the collections of test instruments that are associated with each test cell and to make the process of managing multiple test cells more coherent, each test instrument is provided with an associated instrument driver. Instrument drivers are plug-in software modules that reside in an instrument drivers folder. The instrument drivers serve as an interface between the software of the test type modules and the hardware of the test instruments.

When it is desired to perform a particular test on a given test cell, a test type module for the desired test may be run on the given test cell. The test type module uses appropriate instrument drivers to control instruments at the given test cell. If desired, the same test can be performed on a different test cell by running the test type module on that test cell. When running the test type module on the new test cell, the test type module will invoke the instrument drivers that are appropriate for interfacing with the test instruments of the new test cell.

Complex tests may be performed based on test recipes (also sometimes referred to as test algorithms or configuration scripts). In a typical scenario, a test recipe is generated by a user in a test recipe editor (e.g., a Web-based editing application) via an internet browser. The user loads the desired recipe into a test cell and starts the test. Based on the test recipe, the test cell may identify which test types are to be performed at the test cell. For each identified test type, a corresponding test type module may be run at the test cell. As each test type module is run, the test type module invokes an associated set of instrument drivers. The instrument drivers are used to provide an interface between the test type module and the test instruments at the test cell. After desired test measurements have been made by the test instruments under the control of the test type module, test measurement data may be uploaded to a database associated with a server.

An illustrative test management system is shown in FIG. 1. As shown in FIG. 1, system 10 may have a server 12. Server 12 may be implemented using or more computers at one or more locations. In the example of FIG. 1, server 12 is depicted as containing a processor such as processor 14, storage 16, and user interface 12. Processor 14 may be formed from any suitable computing equipment. Storage 16 may be hard-drive-based or memory-based storage (as an example). User interface 18 may include user input devices such as keyboards and pointing devices. User interface 18 may also include user output devices such as speakers and displays. A user at server 12 may use user input interface 18 to supply commands (e.g., to instruct server 12 to perform a test, to enter parameters for a test, to transfer data within system 10, etc.).

Server 12 may be connected to one or more test cells 20 over network 36. Network 36 may be a local area network (e.g., an Ethernet network) or a wide area network (e.g., a network including a local area network and the Internet) and may involve wired or wireless links.

Test cells 20 may each have a number of instruments 26. Instruments 26 may be any suitable test equipment such as voltmeters, voltage generators, capacitance meters, ellipsometers, function generators, lock-in amplifiers, etc. Instruments 26 may be electrically coupled to probe station 22. Probe station 22 may be used to make measurements on test structures that are located on a substrate such as wafer 24. During testing, the probe head of probe station 22 makes contact with pads or other suitable contact structures associated with the test structures. Each test cell 20 may have a user interface 34 (e.g., a display, speakers, keyboard, pointing device, etc.). Processor 30, storage 32, and user interface 34 may be implemented using one or more computers or other suitable computing equipment. Processor 30, storage 32, and user interface 34 are sometimes referred to as a test controller.

Figure 2:
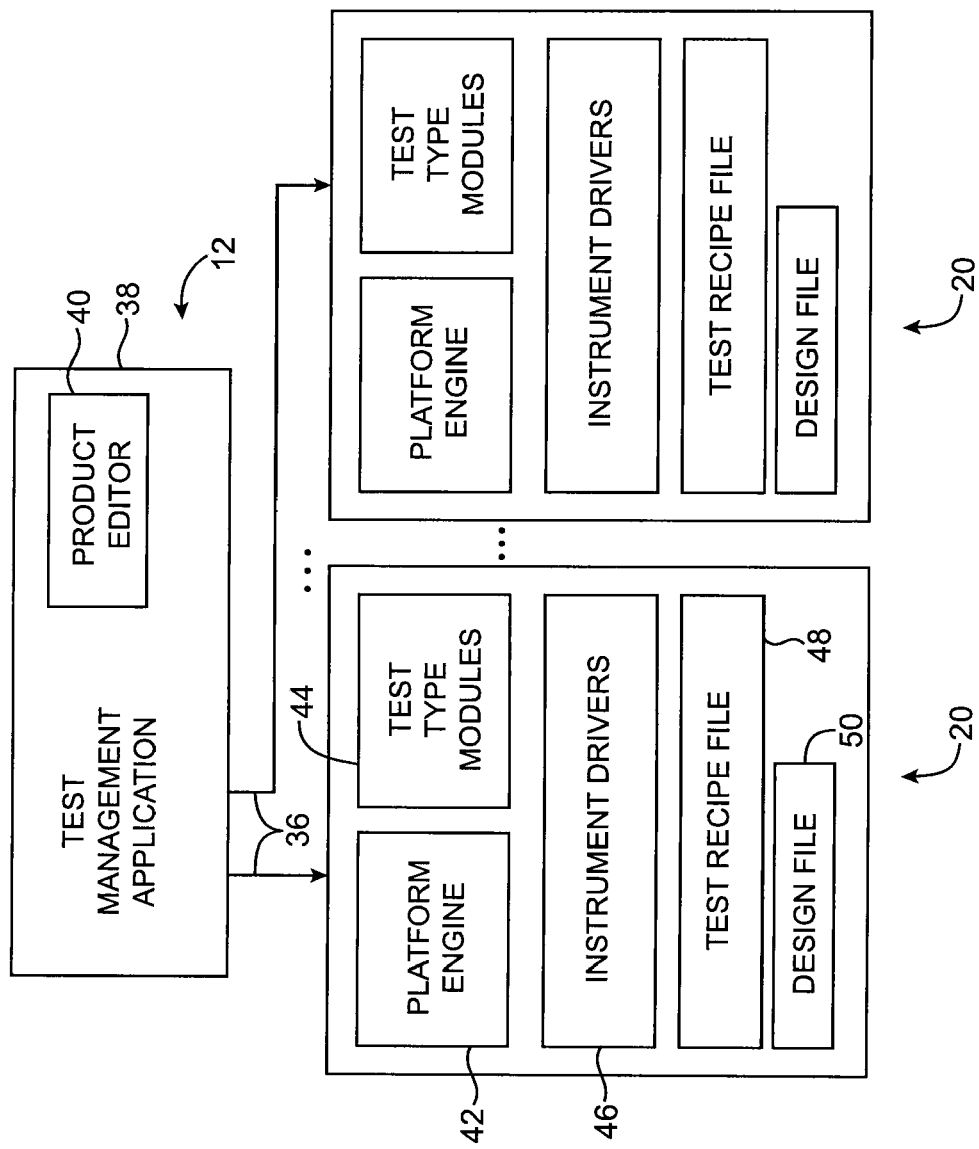
FIG. 2 is a diagram showing illustrative software and data structures that may be used in a test management system of the type shown in FIG. 1 in accordance with an embodiment of the present invention.

A test management application may be run on server 12 (e.g., using processor 14 and storage 16). Platform engines may run on each test cell (e.g., using test controllers 28). As shown in FIG. 2, test management application 38 may be used to distribute test recipes 48 to test cells 20 over network 36. When a test recipe (file 48 or database data) is received and run at a given test cell, the platform engine 42 of that cell invokes appropriate test type modules 44 on that cell (for example, test types may be located in a test type folder on the test controller 28 of the cell or remotely) to perform the test procedures specified by the test recipe. The platform engine is an execution engine that handles the test type modules. Probe station commands (e.g., for positioning a substrate during a test) may be handled by platform engine 42.

As each test type module 44 is called and runs on a test cell, the test type module 44 invokes appropriate instrument drivers 46. Each test type module has an associated configuration file. The configuration file includes a list of instruments and, for each instrument and each parameter handled by the instrument (e.g., current, voltage, etc.), the configuration file includes a range of permitted values and the name of an associated instrument driver 46. Using instrument drivers 46 as an interface, the test type module 44 uses the test instruments 26 and probe station 22 (FIG. 1) to make test measurements on the test structures. The test type module may, for example, perform tests on test structures that are associated with die on a wafer 24 or other suitable substrate. Different tests may be performed by loading different sets of test structures and/or by running different test type modules at the test cell.

If desired, the same test recipe 48 (including, for example, tests associated with one or more of the same test type modules) may be performed at more than one test cell. As an example, a voltage breakdown test may be performed at one test cell using a voltage breakdown test type module and the instruments available in that test cell or may be performed at different test cell using the same voltage breakdown test type module, but using the instruments available at the different test cell. At any given cell, each test type module need only use the instrument drivers for the test instruments that are needed to perform the desired test at that test cell. Because the same test type module may be run on multiple cells, the arrangement of FIG. 2 provides flexibility and allows multiple test cells to be used in parallel (e.g., to enhance throughput or to accommodate situations in which a particular test cell is offline for servicing). Because of the use of instrument drivers 46, it is not necessary to customize the test recipe and test type modules to accommodate the variety of test instruments available at each test cell. If desired, a user of system 10 may select which test cell(s) is to be used to perform tests based on the capabilities of each test cell (e.g., to perform voltage measurements on a cell that can support a desired voltage sweep range).

As shown in FIG. 2, test management application 38 may have an associated product editor 40. Specific die designs (typically with unique substrate layouts) are associated with different products. Each product includes a set of electrical devices (e.g., simple structures such as blanket substrate films or more complex test structures such as prototype electrical devices) in a defined layout. A product may include different types of devices. Design files 50 may be used to store test structure information such as wafer size, wafer layout, mappings of pads to devices, die count, die pitch, die size, types of test structures, pad locations, pad counts, pad pitch, and probe tip size, etc. Product editor 40 may be used to create a product file that is stored in a server database (i.e., in storage 16 of FIG. 1). When setting up a test at server 12, a user can select a desired type of product or test structure (e.g., a memory cell). The test management system can then automatically narrow down the available tests that may be performed by the system based on the selected device type. When a user selects a desired test recipe, the test recipe is conveyed to appropriate test cells 20 over network 36. At each test cell, the recipe file 48 is used to specify which design file 50 is to be loaded to perform a test.

Figure 3:
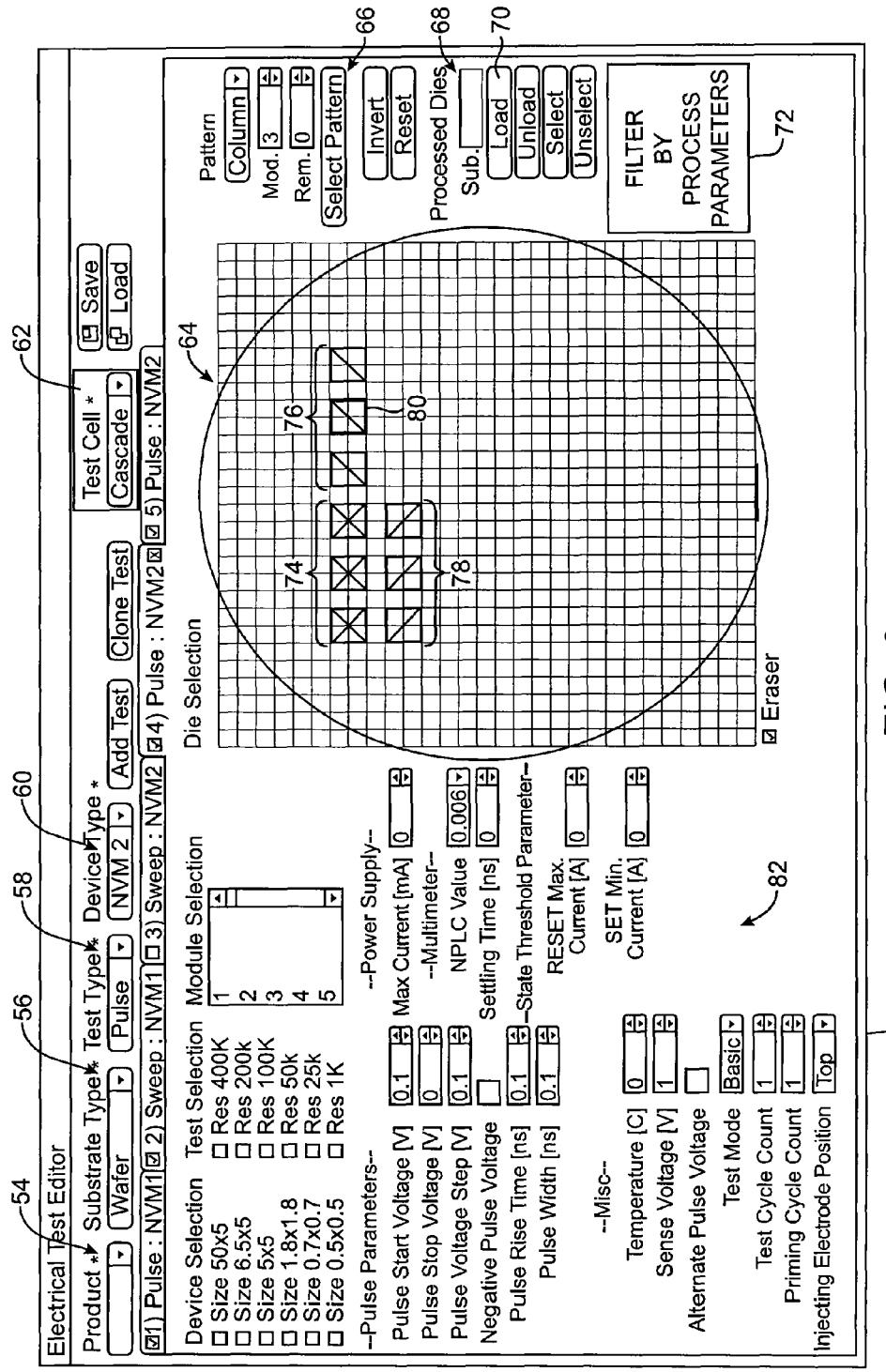
FIG. 3 is an illustrative test recipe setup screen that may be displayed by a test management system in accordance with an embodiment of the present invention.

An illustrative test recipe setup screen that may be presented to a user is shown in FIG. 3. As shown in FIG. 3, test type parameter form 82 includes test settings from a test type profile used to run an individual test that may be part of a larger test recipe. For example, the test being edited in screen 52 is for "Pulse: NVM 2." Other tests in the recipe (that may be selected using tabs) include "Pulse: NVM 1" and "Sweep: NVM 2." The test recipe may be used to perform a battery of tests on a substrate. The on-screen options that are provided in screen 52 allow a user at server 12 to generate a test recipe. Product option 54 may be used to select a product name. Substrate type option 56 may be used to identify a substrate type to be tested. Examples of substrate types include "wafer" and "coupon" (a piece of a wafer with one or more test sites). Test type option 58 may be used to select which test algorithm to use. In the example of FIG. 3, a test algorithm labeled "pulse" is being used. Device type option 60 may be used to specify the device type to be tested (e.g., a memory cell, a transistor, etc.). Test cell option 62 may be used to select a test cell of interest.

Die selection region 64 may be used to select which die to test. The region 64 is a graphical representation of the substrate including one or more processed dies. If desired, historical process information can be overlaid on region 64. Select pattern option 66 may be selected by a user when it is desired to perform pattern-based test site selection options (e.g., to select every site on a wafer, when it is desired to use a checkerboard pattern to select test die, etc.).

In the example of FIG. 3, nine test sites (die locations) are shown in region 64, each corresponding to a test structure that may be tested. Test sites 74 are labeled similarly because they each were formed using the same fabrication process. Similarly, test sites 76 are all represented using the same type of icon, as are test sites 78. A selected test site 80 in test sites 76 has been highlighted (in this example), to indicate that a user has clicked on that test site.

Through interfaces such as screen 52, system 10 can be used to coordinate the testing of potentially very large sets of test structures. For example, system 10 may be used in combinatorial processing environments in which it is desirable to test several potential combinations of structures, materials, and fabrication techniques. This type of testing is often used when it is not possible to analytically predict which design and processing parameters will produce the best results. By using combinatorial testing techniques and an electronic test system such as system 10, it may be practical to perform large numbers of tests in a reasonable amount of time.

For example, test sites 74 may be formed using different processes, materials, or process sequences than test sites 76 and test sites 78. Each of the test sites 74, 76, and 78 can be characterized using the test devices and instruments described herein. The results of the characterization can then be compared to select candidates for further testing. For example, the process used to form the test sites 74 may provide the most desirable results, in which case that process can be advanced for another round of study.

Region 68 of screen 52 may be used to enter a substrate number. Load button 70 may be used to initiate a load process that overlays historical information associated with the substrate number entered in region 68 on region 64. Filter by process parameters option 72 may be selected when it is desired to select which test structures are to be tested based on which process parameters were used to fabricate the test structures.

When a user clicks on option 72, a dialog box may be presented that includes options for selecting test sites based on which process parameters were used to fabricate those sites. For example, the dialog box may contain a drop down menu with options such as layer type (e.g., aluminum, copper, etc.) or layer thickness (less than 100 angstroms, 100 angstroms to 200 angstroms, more than 200 angstroms, etc.).

Figure 4:
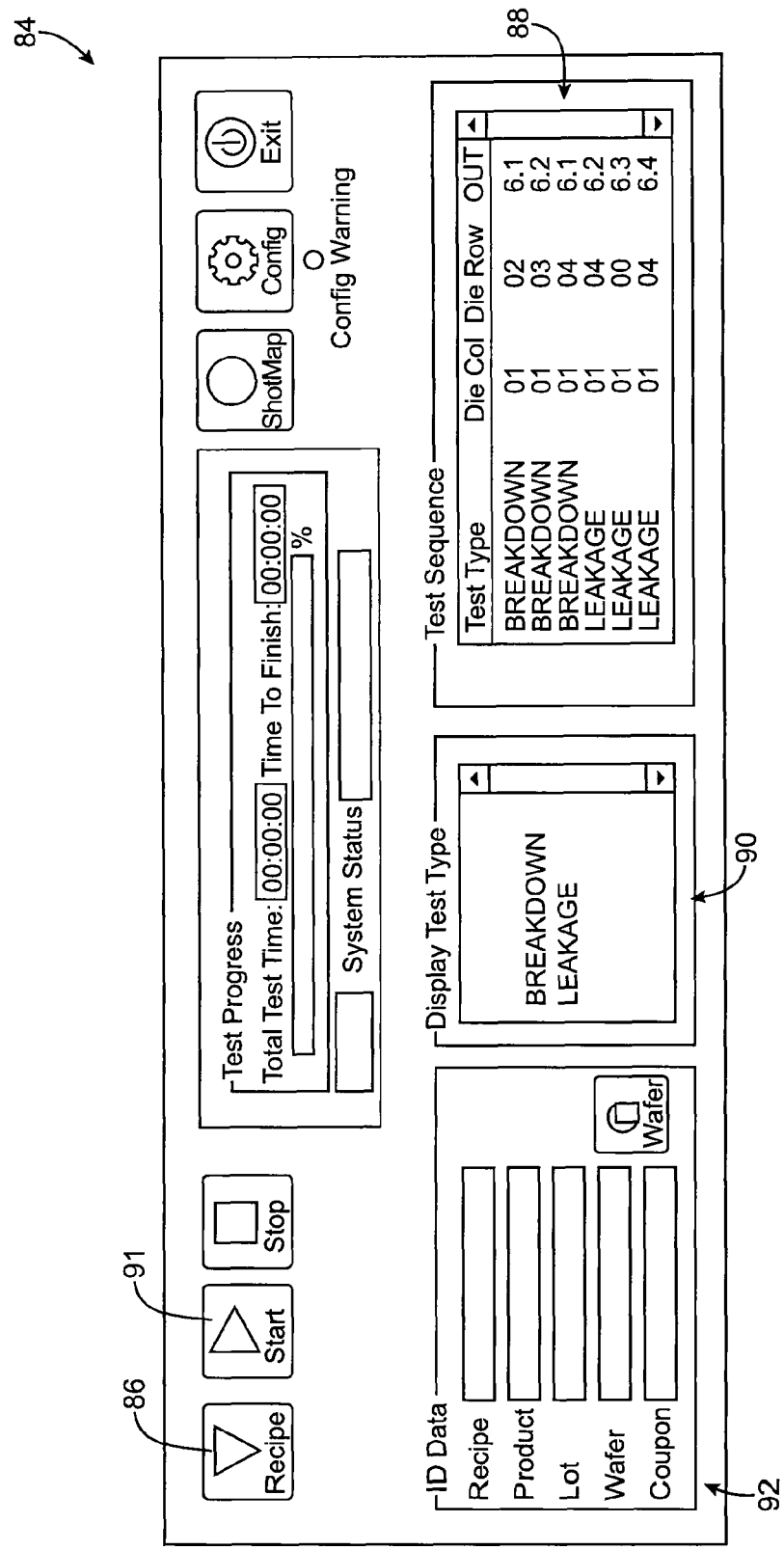
FIG. 4 is an illustrative platform engine interface screen containing test type information that may be displayed by a test management system in accordance with an embodiment of the present invention.

A platform engine user interface screen such as screen 84 of FIG. 4 may be presented to a user by platform engine 42 when it is desired to run a test that has been set up using the test editor of FIG. 3. If the user selects recipe option 86 of FIG. 4, the user may be presented with a select recipe dialog box that allows the user to select a desired recipe and product for testing (e.g., a memory cell can be tested for leakage current, and breakdown voltage). After the recipe has been selected, list 88 is populated to show which tests are associated with various test sites (and test structures). The list 88 may also show the sequence of the tests to be executed. In some embodiments, certain tests should be performed before others. Region 90 may be used to display test types associated with a test recipe (i.e., breakdown voltage and leakage current in this example). A user can select which devices to test by entering information in region 92 (e.g., lot number if multiple wafers are involved, wafer number, coupon number and wafer number for coupon tests, etc.). The testing process may be started by clicking on start option 91.

Figure 5:
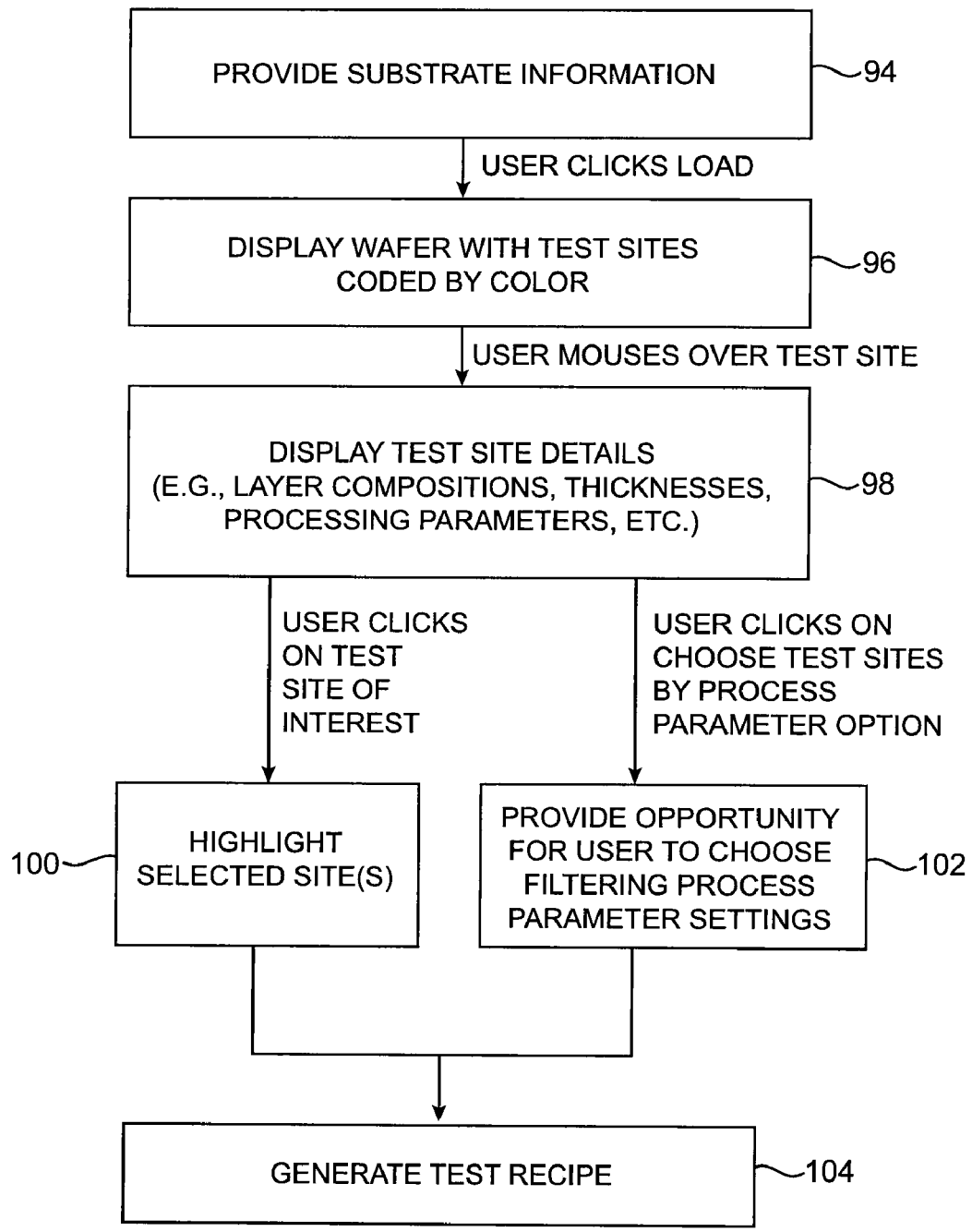
FIG. 5 is a flow chart of illustrative steps involved in setting up a test recipe in accordance with an embodiment of the present invention.

Illustrative steps involved in setting up a test recipe are shown in FIG. 5.

At step 94, the user may provide substrate information for a desired substrate. For example, the user may type substrate information into substrate number region 68 of screen 52 (FIG. 3). The user may then click load button 70.

At step 96, the user may be presented with a region such as region 64 that contains a representation of a wafer (e.g., the circular outline of region 64) in which test sites such as test sites 74, 76, and 78 have been labeled uniquely (e.g., using unique colors or patterns).

As the user mouses over the test sites in region 64, details about the test sites may be displayed on screen 52 such as details about layer compositions, thicknesses, processing parameters, etc. (step 98).

If the user clicks on a test site of interest (e.g., test site 80 of FIG. 3), the selected test site may be highlighted. Multiple sites may be selected in this way. If desired, pattern-based test site selections may be made using option 66.

The user may also click on option 72 of FIG. 3 and use the options of screen 84 (FIG. 4) to select which sites to test based on which the process parameters that were used during fabrication (step 102).

After the desired test sites have been selected by the user, a test recipe for testing the selected sites may be generated (step 104).

Figure 6:
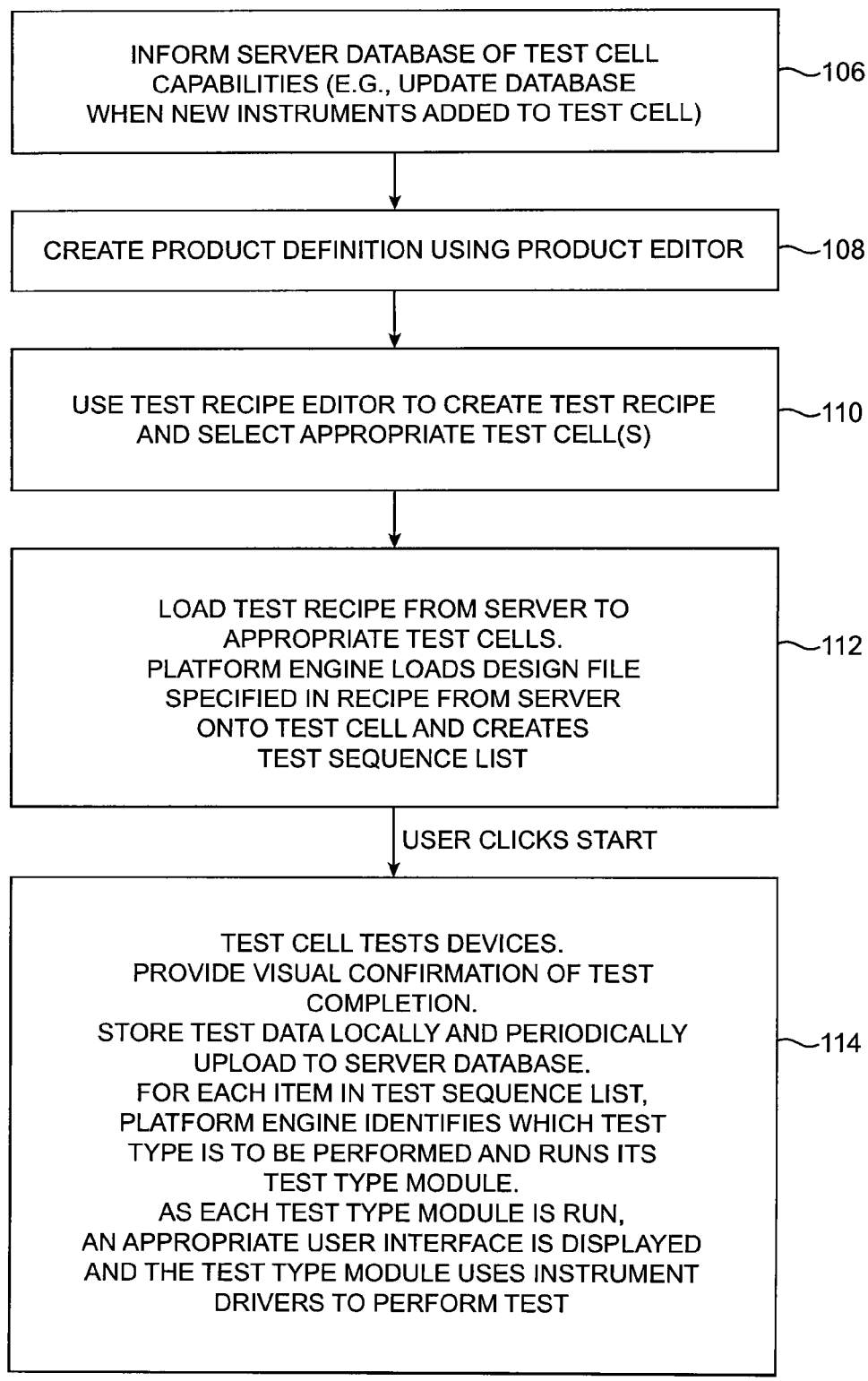
FIG. 6 is a flow chart of illustrative steps involved in using a test management system with test cells to perform tests on wafers of test structures based on test recipes in accordance with an embodiment of the present invention.

Illustrative steps involved in using system 10 to perform tests are shown in FIG. 6.

At step 106, server 12 may be informed of the test cell capabilities of test cells 20. For example, whenever a test cell is updated to include new test instruments, that test cell can publish its capabilities to a database maintained on storage 16. If desired, the update may be performed by using the "config" button on screen 84 of FIG. 4.

At step 108, product editor 40 (FIG. 2) may be used to create a product definition.

At step 110, a test recipe editor may be used to create a test recipe and to select appropriate cells. The user's on-screen options for choosing which parameters are to be tested may be restricted based on which test cell has been selected. Test cells may be selected based on selected products and test types. For example, a product with eight pads requires a probe station with an eight-pin probe card, so a test cell that has that type of probe head on its probe station may be selected. As another example, a time-dependent dielectric breakdown test might require a power supply and a voltmeter, so a test cell with those instruments available could be selected.

After selecting appropriate test cells to perform the desired tests, the test recipe may be provided from server 12 to appropriate test cells 20 over network 36 (step 112). As the recipe is loaded, the platform engine 42 in each test cell may load a design file 50 specified in the recipe from server 12 to the test cell 20 over network 36. Once the design file has been loaded, the platform engine 42 may create a test sequence list.

At step 114, the test cell performs tests on the appropriate test structures at that test cell. During the operations of step 114, the platform engine 42 determines which test type is to be performed for each item in the test sequence list and runs its test type module. The test type module obtains test parameters from the recipe by loading the recipe test profile—i.e., voltage ranges, etc. The test type module may display an appropriate user interface for the user while performing the desired test using appropriate instrument drivers. At a given test cell, different sets of test structures may be tested using different test modules and different test recipes.

When performing the same type of test, the same test type module may be run on different cells. Different test cells may also run different test modules to perform different tests.

The foregoing is merely illustrative of the principles of this invention and various modifications can be made by those skilled in the art without departing from the scope and spirit of the invention.

What is claimed is:

1. A method for testing test structures on substrates using a plurality of test cells, wherein each test cell has a plurality of test instruments each having an associated instrument driver, the method comprising:
 receiving a substrate having a plurality of combinatorially processed regions, the combinatorially processing forming the regions with one of different material, different processes or different process sequences;
 at a first test cell testing a first combinatorially processed region, obtaining a given test recipe and, based on the given test recipe, identifying which test types are to be performed on the test structures at the first test cell;
 at the first test cell, running at least a given test type module that corresponds to a given one of the identified test types, wherein when the given test type module is run, a first set of instrument drivers is invoked to test the test structures using the instruments of the first test cell;
 at a second test cell, obtaining the given test recipe and, based on the given test recipe, identifying which test types are to be performed on the test structures at the second test cell for testing a second combinatorially processed region; and
 at the second test cell, running at least the given test type module that corresponds to the given one of the identified test types, wherein when the given test type module is run, a second set of instrument drivers is invoked to test the test structures using the instruments of the second test cell, wherein the first and second sets of instrument drivers are different, and wherein one of the test types performed at the first cell is a voltage breakdown test that is destructive to the test structures at the first cell.

2. The method defined in claim 1 wherein a test management server is connected by a network to the first and second test cells, wherein obtaining the given test recipe at the first test cell comprises obtaining the given test recipe at the first test cell from the test management server over the network, and wherein obtaining the given test recipe at the second test cell comprises obtaining the given test recipe at the second test cell from the test management server over the network.

3. The method defined in claim 1 wherein the substrates comprise wafers and wherein each test cell comprises a probe station, the method further comprising testing the test structures on the wafers using the probe stations and wherein the voltage breakdown test that determines a voltage that causes the test structures of the first test cell to fail.

4. The method defined in claim 1 wherein the test cells each include a probe station, the method further comprising:
testing the test structures at the first test cell using the probe station and instruments of the first test cell; and
testing the test structures at the second test cell using the probe station and instruments of the second test cell.

5. The method defined in claim 1 wherein there are a plurality of identified test types for tests to be performed on the test structures at the first test cell, the method further comprising:
at the first test cell, running a plurality of test type modules each of which corresponds to a respective one of the plurality of identified test types to test the test structures using the instruments and a probe station of the first test cell.

6. The method defined in claim 1 further comprising:
at the second test cell, running a test type module other than the given test type module to test the test structures at the second test cell.

7. The method defined in claim 1 further comprising:
at the first test cell, running a first set of test type modules to test a first set of test structures on a given substrate; and
at the first test cell, running a second set of test type modules that is different from the first set of test type modules to test a second set of test structures on the given substrate.

8. The method defined in claim 1 wherein the test structures are located on a given substrate and wherein running at least the given test type module at the first test cell invokes the first set of instrument drivers and tests the test structures on the given substrate using the instruments of the first test cell, the method further comprising:
at the first test cell, running at least the given test type module to test different test structures on the given substrate using the instruments of the first test cell.

9. The method defined in claim 1 wherein running at least the given test type module at the first test cell comprises running at least the given test type module to test a first set of die on a given substrate, the method further comprising:
at the first test cell, running the same given test type module to test a second set of die on the given substrate.

10. The method defined in claim 1 wherein running at least the given test type module at the first test cell comprises running at least the given test type module to test a first set of test structures associated with a first set of die on a given substrate by using the instruments of the first test cell to measure a first set of parameters, the method further comprising:
at the first test cell, running same given test type module to measure a second set of parameters when performing test structure tests using the instruments of the first test cell.

11. The method defined in claim 1 further comprising:
while running the given test type module to invoke the first set of instrument drivers to test the test structures at the first test cell, displaying visual feedback to a user at the first test cell indicating which test structures have been tested.

12. The method defined in claim 1, wherein a test management server that has a server database is connected by a network to the first and second test cells, the method further comprising:
adding test instruments to the first and second test cells; and
when the test instruments are added to the first and second test cells, updating the test management server database to reflect which instruments are included in the first and second test cells.

13. The method defined in claim 1 wherein the test structures are fabricated on a substrate using fabrication processes having associated fabrication process parameters, the method comprising:
providing a user with an option to select which test structures on the substrate are to be tested at the first test cell based on which fabrication process parameters were used during fabrication of the test structures on the substrate, wherein one of the fabrication process parameters is related to a deposition process.

14. A test system comprising:
a first test cell having a first set of test instruments and configured to run a given test type module to perform a given type of test on test structures at the first cell using the first set of test instruments; and
a second test cell having a second set of test instruments and configured to run the given test type module to perform the given type of test on test structures at the second cell using the second set of test instruments, wherein the second set of test instruments is different than the first set of test instruments, and wherein at least one of the test structures of a region of a die of the first cell is formed through a combinatorial process by utilizing one of a different process material, or process sequence than other similar test structures of the region of the die.

15. The test system defined in claim 14 further comprising:
a test server to which both the first test cell and the second test cell are connected through a network, wherein the test server provides a test recipe to the first test cell and the second test cell over the network and wherein the first cell runs the given test type module based on the test recipe and wherein the second cell runs the given test type module based on the test recipe.

16. The test system defined in claim 15 wherein the test server comprises a server database, wherein when test instruments are added to the first and second cells, the server database is updated to reflect which instruments are included in the first and second cells.

17. The test system defined in claim 14 further comprising a probe station at the first test cell, wherein the test structures are fabricated on a substrate using a fabrication process having associated fabrication process parameters and wherein the first test cell uses a processor to provide a user with an opportunity to choose which test structures on the substrate are to be tested based on which fabrication process parameters were used during fabrication of the test structures.

18. A method of testing test structures on substrates in a test system wherein each test cell has a different set of instruments, the method comprising:
performing the same test on test structures at each of the plurality of test cells by running a common test type module on each of the test cells, wherein the test type module invokes unique sets of instruments drivers on each of the test cells;
providing visual confirmation of which test structures are tested prior to initiation of the testing;
during testing of the test structures, storing test data in local databases on the test cells; and
periodically uploading the test data from the test cells to a server over a network, wherein at least one of the test structures of a region of a die of the first cell is formed through a combinatorial process by utilizing one of a different process material, or process sequence than other similar test structures of the region of the die.

19. The method defined in claim 18 further comprising generating a test sequence list on each test cell that indicates which tests are to be performed by test type modules on that test cell.

20. The method defined in claim 18 further comprising:
at each test cell, using a platform engine to identify which types of tests are to be performed and, for each type of test that is identified, running a corresponding test type module with the platform engine, wherein each test type module that is run invokes a respective unique set of instrument drivers.

21. The method defined in claim 18 further comprising:
loading a test recipe from a server database at the server onto the local database at a given one of the test cells over the network;
at the given one of the test cells, using a platform engine to identify from the loaded test recipe which types of tests are to be performed and, for each type of test that is identified, running a corresponding test type module with the platform engine to invoke at least one of the instrument drivers.

22. The method defined in claim 18 further comprising:
at a given one of the test cells, providing a user with an on-screen option to select which test structures on a given substrate are to be tested based on which process parameters were used during fabrication of the test structures.

23. The method defined in claim 18 further comprising:
providing one of layer composition or layer thickness for layers in which the test structures are defined prior to the initiation of the testing.

24. The method defined in claim 18 further comprising:
at a given one of the test cells, providing a user with an option to select which test structures on a given substrate are to be tested based on which process parameters were used during fabrication of the test structures; and at the test cells, providing visual confirmation of which test structures are tested during testing of the test structures.

25. The method defined in claim 18 further comprising:
loading a test recipe from a server database at the server onto the local database at a given one of the test cells over the network;
at the given one of the test cells, providing a user with an option to select which test structures on a given substrate are to be tested based on which process parameters were used during fabrication of the test structures on the given substrate; and
at the given one of the test cells, using a platform engine to identify from the loaded test recipe and the user-selected test structures which types of tests are to be performed and, for each type of test that is identified, running a corresponding test type module with the platform engine to invoke at least one of the instrument drivers.

26. The method defined in claim 18 further comprising:
loading a test recipe from a server database at the server onto the local database at a given one of the test cells over the network;
at the given one of the test cells, providing a user with an option to select which test structures on a given substrate are to be tested based on which process parameters were used during fabrication of the test structures on the given substrate;
at the given one of the test cells, using a platform engine to identify from the loaded test recipe and the user-selected test structures which types of tests are to be performed and, for each type of test that is identified, running a corresponding test type module with the platform engine to invoke at least one of the instrument drivers; and
at the given one of the test cells, providing visual confirmation of which test structures are tested during testing of the test structures.

* * * * *